United States Patent [19]

Nazarathy et al.

[11] Patent Number: 5,424,680
[45] Date of Patent: Jun. 13, 1995

[54] PREDISTORTER FOR HIGH FREQUENCY OPTICAL COMMUNICATIONS DEVICES

[75] Inventors: Moshe Nazarathy, Haifa, Israel; Charles H. Gall, Newark; Chien-Yu Kuo, Cupertino, both of Calif.

[73] Assignee: Harmonic Lightwaves, Inc., Santa Clara, Calif.

[21] Appl. No.: 162,405

[22] Filed: Nov. 30, 1993

[51] Int. Cl.$^6$ ............................................. H03F 1/32
[52] U.S. Cl. .................... 330/149; 359/153; 359/161; 327/317; 327/133
[58] Field of Search ................. 330/149; 328/142, 144, 328/163; 359/153, 161, 180

[56] References Cited

U.S. PATENT DOCUMENTS

| | | | |
|---|---|---|---|
| 4,068,186 | 1/1978 | Sato et al. | 330/149 |
| 4,329,655 | 5/1982 | Nojima et al. | 328/163 X |
| 4,992,754 | 2/1991 | Blauvelt et al. | 330/149 |
| 5,127,072 | 6/1992 | Blauvelt et al. | 358/88 |
| 5,132,639 | 7/1992 | Blauvelt et al. | 330/149 |
| 5,172,068 | 12/1992 | Childs | 330/149 X |
| 5,179,461 | 1/1993 | Blauvelt et al. | 359/189 |
| 5,252,930 | 10/1993 | Blauvelt | 330/49 |

OTHER PUBLICATIONS

H. M. Achor, "An Invertible Volterra Model of Second-Order Distortion in DFB Lasers", IEE Photonics Technology Letters, vol. 5, No. 3, Mar. 1993, pp. 294–297.

Toshio Nojima et al., "Predistortion Nonlinear Compensator for Microwave SSB-AM System", Electronics and Communications in Japan, vol. 67-B, No. 5, 1984, pp. 57–66.

IEEE Photonics Letters, vol. 4, No. 7, Jul. 1992, p. 792.

I. V. Kalmykov et al., "A Method of Compensating the Nonlinear Distortions of Light-Emitting and Laser Diodes in Broadband Analog Communications Systems", originally published in Radiotekhnika, No. 6, 1989, pp. 77–79.

Manfred Bertelsmeier et al., "Linearization of Broadband Optical Transmission Systems by Adaptive Predistortion", Freguenz, 38(1984)9, pp. 206–212.

Primary Examiner—James B. Mullins
Attorney, Agent, or Firm—Skjerven, Morrill, MacPherson, Franklin & Friel; Norman R. Klivans

[57] ABSTRACT

A generalized frequency dependent predistortion circuit for nonlinear optic devices such as semiconductor lasers and light emitting diodes includes a pre-filter and post-filter associated with a linearizer (distorter). A multi-channel sub-carrier electrical signal is input to a splitter which provides on a primary path a signal to a time delay and hence to a coupler to the secondary paths. In the first secondary path, a pre-filter provides a signal to a second order distorter. This signal is then subject to a post-filter and then to a variable attenuator. In the second secondary path, a third order distorter again has an associated pre-filter and post-filter with a variable attenuator downstream of the post-filter. The variable attenuators in each path provide frequency independent attenuation. In one version the distorters in both paths are nonlinear diode circuits. The second secondary path provides very low fundamental leakthrough. The pre- and post-filters are of similar design with differing component values, each filter being an integral equalizing filter which arbitrarily manipulates phase and amplitude in a frequency dependent fashion. Each is a synthesized filter tuned or built to a specific complex frequency-dependent profile to linearize a particular individual laser unit.

16 Claims, 14 Drawing Sheets

PREDISTORTER FOR HIGH FREQUENCY OPTICAL COMMUNICATIONS DEVICES

BACKGROUND OF THE INVENTION

This invention relates to an electronic circuit for providing a linearized output from an amplitude modulated transmission device such as a semiconductor laser or other electro-optical device, the output signal of which is distorted relative to its input signal due to inherent nonlinearity. This distortion is compensated for by predistorting the input signal, such that the inherent distortion of the transmission device restores the undistorted signal.

DESCRIPTION OF THE PRIOR ART

It is well known to modulate the analog intensity of an optical source such as a light emitting diode (LED) or semiconductor laser using an electric signal, in order to transmit analog signals such as sound or video signals on optical fibers or other media. Such amplitude modulation typically suffers from noise and nonlinearity of the optical source. Distortion inherent in analog transmitters such as semiconductor lasers prevents a electrical modulation signal from being converted linearly to an optical signal, and instead distorts the signal. This is especially problematic with broadband signals such as a multi-channel video transmission system (i.e., cable television) which requires a high degree of linearity to prevent cross channel interference.

It is well known to reduce the distortion inherent in nonlinear devices by using predistortion. A modulation signal is combined with a signal equal in magnitude to the distortion inherent in the nonlinear device but opposite in sign. When the combined signal propagates through the nonlinear device, the inherent distortion in the nonlinear device is cancelled by the combined signals' predistortion, and only the linear part of the source signal is transmitted.

An example is disclosed in Blauvelt et al., U.S. Pat. No. 5,132,639 issued Jul. 21, 1992. (Present FIG. 1 disclosure is identical except for reference numbers to FIG. 5 of that disclosure and is described hereinafter.) An RF input signal on line 12 feeds into a directional coupler 10 which splits the input signal into a primary electrical path 13 and a secondary electrical path 14. Typically the portion of the signal on the primary electrical path 13 is substantially higher in power than the portion of the signal on the secondary electrical path 14. For example, an 11 dB directional coupler 10 may be used to achieve this result.

The secondary electrical path includes (in series) distortion generator 15, amplitude adjustment (tilt) block 17, frequency adjustment block 19, and fine phase adjustment block 21. The output signal of the distortion generator 15 includes nonlinear modulation distortion of the input signal frequencies. Second and/or higher order harmonic distortion and intermodulation products may be produced.

The distorted output signal from the distortion generator is matched in magnitude to the magnitude of inherent distortion determined in the transmission device (not shown) receiving the output signal on line 25.

Typically a time delay adjustment element 23 present in the primary electrical path 13 produces a delayed modulation signal on line 24.

The first secondary path 7 in FIG. 1 is supplemented by second secondary path 6. Path 6 similarly includes a distortion generator 35, amplitude adjustment block 37, frequency tilt adjustment 39 and fine phase adjust 41. Path 6 provides an output signal on line 42 which is combined with the output signal on line 22 from the first secondary path 7 at directional coupler 11. In this example second secondary path 6 would generate for instance third order cancellation signals.

However, it has been found that the predistortion circuit of FIG. 1 is inadequate for many applications and requires to start with an inherently linear transmission device, i.e. a relatively expensive semiconductor laser. That is to say, the linearization properties of the circuit of FIG. 1 are inadequate for use with many semiconductor lasers for typical applications since the amount of predistortion linearization achieved with the prior art system is limited.

SUMMARY OF THE INVENTION

In accordance with the invention there is provided a generalized frequency-dependent predistortion circuit for a nonlinear electro-optic device, such as semiconductor laser, a light emitting diode, a $LiNbO_3$ electro-optic modulator fed by a CW laser, or an externally modulated laser. Two separate linear filters are provided, one located before and one located after a nonlinear generator (distorter) in each secondary signal path of the predistortion circuit.

A multi-channel sub-carrier electrical (RF) signal is input to a splitter which provides on a primary path of the predistortion circuit a signal to a time delay element and hence to a coupler to the secondary paths. In the first secondary path, a pre-filter provides the signal to a second order ($X^2$) distorter. The signal is then subject to a post-filter and then to a variable attenuator. In the second secondary path, a third order ($X^3$) distorter again has an associated pre-filter, post-filter, and variable attenuator. The variable attenuator in each path provides constant (frequency independent) attenuation. In one embodiment, the distorters in both paths are nonlinear diode circuit.

In one embodiment, the pre- and post-filters in both secondary paths are identical in terms of overall structure, each being an integral equalizing filter which arbitrarily manipulates phase and amplitude in a frequency-dependent fashion. Each is a synthesized filter tuned or built to a specific complex frequency-dependent profile to linearize the output of a particular individual laser unit. Each of these synthesized filters is a filter network which affects phase and amplitude together.

Advantageously, the pre-filter and post-filter mimic, in an inverse vector fashion for both phase and amplitude at each frequency, the nonlinearities of the output device so as to cancel out these nonlinearities. This is different in principle from the above-described prior art which first mimics the tilt, i.e. amplitude nonlinear aspect of the laser, and independently corrects for phase variation.

The pre-filter and post-filter for a linearizer in two secondary paths of a predistorter may be generalized in accordance with the invention to (1) a predistorter with a primary path and only a single such secondary path correcting, e.g. the second or third order nonlinearities, and also to (2) a predistorter with n secondary paths where $n \geq 3$. For many semiconductor lasers, it has been found inadequate to correct only the second order harmonics in order to provide a linear laser output.

DETAILED DESCRIPTION OF THE INVENTION

Theory of Operation

The present invention is directed to a solution to the above-described problem of linearizing an output signal from an inherently nonlinear device such as a semiconductor laser or other electro-optic device. In a semiconductor laser, such as a distributed feedback (DFB) laser, the nonlinear "beats" are strongly frequency dependent in both magnitude and phase. Therefore in accordance with the invention the linearizer circuits track the magnitudes and phases of the beats over a wide frequency range; the nonlinear phase as well as magnitude of the laser output is modelled or measured at various frequencies in order to tune the filters associated with the linearizer circuits to provide a proper amount of predistortion.

The prior art (such as the above-referenced Blauvelt et al. disclosure) assumes that frequency shaping is achieved by frequency dependent filtering such as a frequency tilt circuit series-connected to the distortion generator. However, it has been determined that this is not sufficient to synthesize an arbitrary distortion of the second order. Instead, it has been found that it is necessary to have frequency shaping both before and after the nonlinear distortion generator to achieve better suppression of the beats generated by the output device (laser). These two frequency shaping filters are referred to herein as the pre-filter and post-filter.

Figure 2:
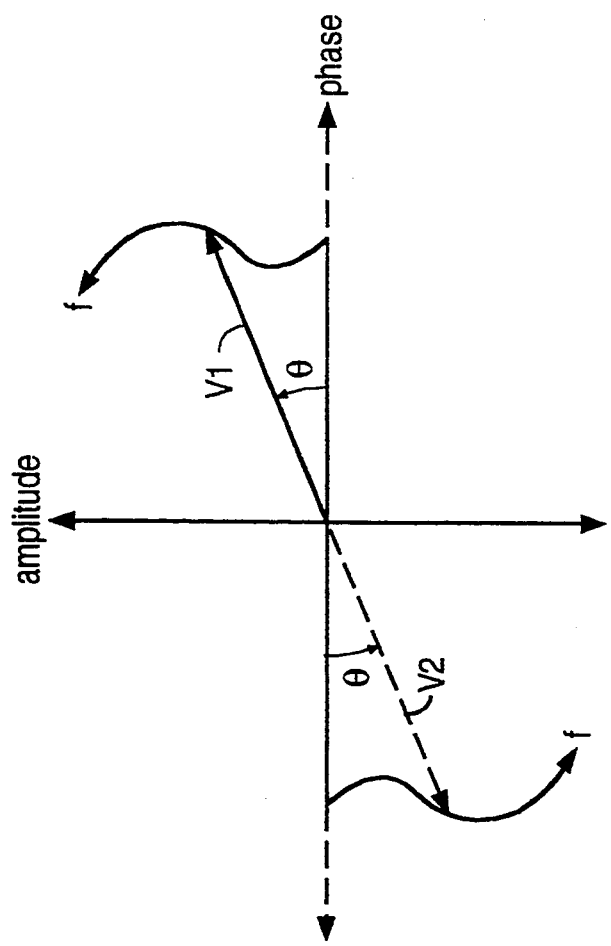
FIG. 2 shows diagrammatically a principle of operation in accordance with the invention.

FIG. 2 shows graphically one aspect of a theory of operation in accordance with the present invention. The laser has inherent nonlinearity designated by the beat vector V1 which has a particular phase and amplitude for each of a range of intermediate frequencies f. The object is to cancel out this nonlinearity at all frequencies f. Therefore in accordance with the invention, a complementary (sums to 180°) vector V2 is provided by the predistorter having the same absolute value amplitude as V1 but in the opposite direction, and the same absolute value but 180° out of phase for each frequency f. The frequency shaping of the vector V2 is achieved by the combination of the pre-filter, nonlinear generator and post-filter. Missing any of this elements, such as the pre-filter or having a pre-filter but no post filter, will result in imperfect or reduced tracking of the two vectors.

The above graphical description is mathematically presented hereinafter. The nonlinear response of a second order nonlinear circuit due to an excitation $e^{j\omega_1 t} + e^{j\omega_2 t}$ is given by $$VTF^{(2)}(\omega_1,\omega_2)e^{j(\omega_1+\omega_2)}$$

where $VTF^{(2)}$ is the second order Volterra Transfer Function (VTF), a complex number depending on the two frequencies $\omega_1$ and $\omega_2$, describing the magnitude and phase of the nonlinear response at the sum frequency $\omega_1+\omega_2$. (The difference frequency $\omega_1-\omega_2$ is accounted for by using a negative value for $\omega_2$). Similar definitions apply for the third order VTF, $VTF^{(3)}(\omega_1, \omega_2, \omega_3)$. Ideally the VTF of the predistorter should be the opposite of the VTF of the laser, e.g.:

$$VTF_{predist}^{(2)}(\omega_1,\omega_2) = -VTF_{laser}^{(2)}(\omega_1,\omega_2)$$

DFB lasers exhibit a large range of possible VTFs due to the presence of a large number of complex physical mechanisms accounting for frequency dependent nonlinear responses and due to the natural variations in the relevant parameters governing these responses. (The paper "An invertible Volterra Model of Second-Order Distortion in DFB Lasers" by H. M. Anchor, *IEEE Photonics Technology Letters*, Vol. 5, Mar. 1993, pp. 294–297, derives a model for the VTF of an unlinearized DFB laser.) Therefore DFB lasers are linearized in accordance with the invention by providing the ability to synthesize an arbitrary VTF frequency response by the linearizer circuitry. Imperfect approximation of the desired VTF results in imperfect beat suppression, yielding residual composite distortions.

Implicit in the prior art (e.g., Blauvelt et al., U.S. Pat. No. 4,992,754 issued Feb. 12, 1991) was the assumption that the frequency shaping would be achieved by frequency dependent filtering such as frequency tilt after the nonlinear distortion generator. The present Volterra analysis has established that this is not sufficient to synthesize an arbitrary VTF of second order, and that frequency shaping before the nonlinear distortion generator as well as after it in order to achieve better suppression of the beats generated by the laser is needed.

Figure 3A:
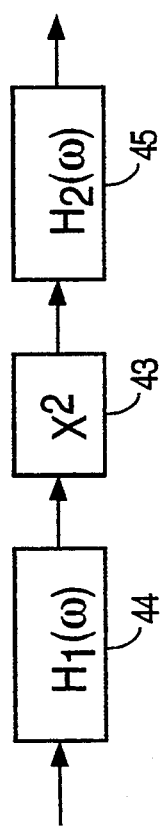
FIG. 3a shows an even order linearizer in accordance with the invention.

An even order linearizer as proposed herein is shown in FIG. 3a.

This apparatus is an ideal squarer 43 followed and preceded by two general linear filters, the pre-filter 44 and post-filter 45. Prior art seems to have recognized the need for a post-filter after the nonlinear circuitry 43, but in accordance with the present invention there is also a pre-filter before the nonlinear circuitry 43 as well, for synthesis of an arbitrary second order Volterra frequency response. In other words, a general Volterra transfer function response can be much better approximated by having the pre-filter 44 in addition to the post-filter 45.

The VTF of the linearizer of FIG. 3a is given by:

$$VTF^{(2)}(\omega_1,\omega_2) = H_1(\omega_1)H_1(\omega_2)H_2(\omega_1+\omega_2)$$

Exciting the laser to be linearized with two tones at frequencies $\omega_1$, $\omega_2$ would yield a response at $\omega_1 \pm \omega_2$ which is generally not constant over the choice of the two tones. The even path of the predistorter is such that the second order intermodulation (IM) product generated in this path has the same variation over the two frequencies $\omega_1$, $\omega_2$ as does the laser response, but is of opposite sign so that the two IM tones, the one generated in the predistorter and the one generated in the laser cancel out. However, assuming only the presence of the filter $H_2(\omega)$ (as in Blauvelt et al. U.S. Pat. No. 4,992,754) the linearizer VTF becomes:

$$VTF^{(2)}(\omega_1,\omega_2)=H_2(\omega_1+\omega_2)$$

i.e. all IM products for which $\omega_1\pm\omega_2$ is constant would yield the same constant response, rather than a desired varying response.

Therefore the only type of laser which could be exactly linearized would be one for which the VTF has the same magnitude and phase for all pairs of frequencies $\omega_1$, $\omega_2$ satisfying the constraint that $|\omega_1|\pm|\omega_2|=\omega_b$ is constant. Therefore only a laser satisfying this particularly restrictive and unlikely condition could be linearized exactly. In order to allow variations of the VTF over the subset of frequencies $\omega_1$, $\omega_2$, satisfying the constraint $|\omega_1|\pm|\omega_2|=\omega_b$, one includes the pre-filter along with the post-filter in the linearizer. According to the first equation above, the response thus is no longer a function of $\omega_1+\omega_2$ only, but a function of both $\omega_1$ and $\omega_2$ individually. The additional degrees of freedom result in a higher degree of linearization suppression achieved with devices with this structure. Given a measurement or a model of the laser VTF at a subset of the possible pairs of frequencies, and using both pre- and post-Volterra filters, one obtains a good approximation for the required VTF.

Detail of Predistorter Circuit

Figure 3B:
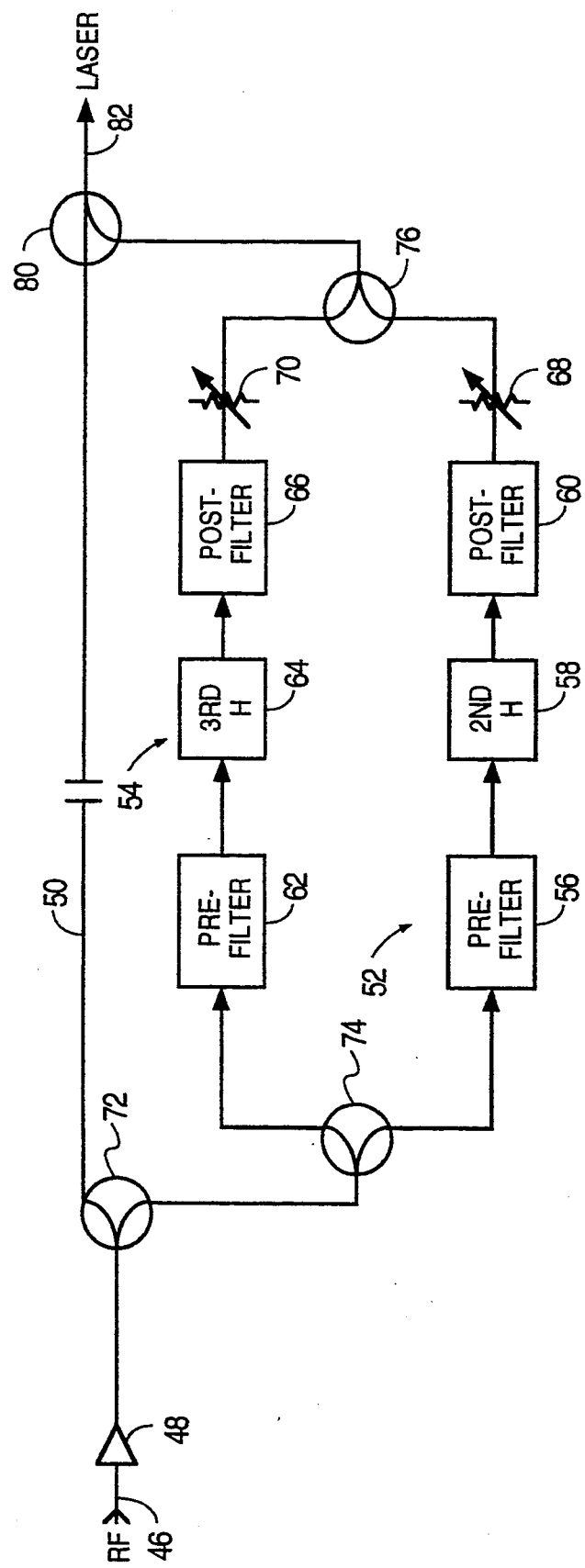
FIG. 3b is a block diagram of a predistorter circuit in accordance with the invention.

FIG. 3b shows one embodiment of a predistorter circuit in accordance with the present invention. An RF signal at input terminal 46 is applied to the first section of the laser driver circuit which is the predriver 48 (described in more detail below.) Predriver 48 is a preamplifier circuit. Predriver 48 is e.g. a linear amplifier so as to generate little distortion of its own, since the predriver 48 distortion cascades with that of the downstream predistorter itself, reducing performance Of the laser (not shown).

The remainder of the circuit of FIG. 3b is the predistorter itself which includes three parallel signal paths: the fundamental (primary) path 50, the secondary even order path 52, and the secondary odd order path 54. The fundamental path 50 is a delay path (typically a delay line of predetermined length), such that the propagation delays through all three paths 50, 52, 54 are equal.

Even order predistorter path 52 includes a pre-filter 56, an even order linearizer (predominantly a second harmonic and intermodulation generator) circuit 58 and a post-filter 60. Similarly the odd order predistorter path 54 includes a prefilter 62, an odd order linearizer (predominantly third harmonic and intermodulation generator) circuit 64 and a post-filter 66.

Paths 52 and 54 also respectively include variable attenuators 68 and 70. Path 50 is joined to paths 54 and 52 by a splitter 72, and the two secondary paths 52 and 54 both connect to a splitter 74 and are recombined by a combiner 76. Combiner 80 combines the fundamental path 50 signal with the output signal of combiner 76. The output signal at terminal 82 is provided to the output device such as a semiconductor laser (not shown). Assuming that the laser, the output of which is to be linearized, has predominant distortions up to third order only, ideally the even order circuit 58 should produce only second order intermodulation, and the odd-order circuit 64 should produce only third order intermodulation. Practically, it has been found that the linearizers 58, 64 produce other orders of distortion at their outputs, and some higher order residual distortion appears even at their inputs which is conventionally minimized.

The splitters and combiners 72, 74, 76 and 80 are broadband radio frequency components, which in one embodiment are commercially available power dividers (a type of hybrid transformer, part #SPD-C5 from Synergy Microwave for example), or may be conventional RF couplers.

The secondary paths 52 and 54 synthesize appropriate nonlinear Volterra Transfer Functions (VTF) of the second and third order respectively, such that the overall net VTF of the predistorter circuit and the laser ideally null out to provide a linear laser output. Volterra transfer functions are a known mathematical method to express signal propagation through nonlinear systems including frequency dependent effects. (See *Nonlinear Microwave Circuits*, Stephen Maas, Artech House, 1988, Chapter 5.)

Since the relationship between the driver current of a laser and the laser output power is not a simple quasi-static nonlinearity but includes frequency dependent effects, the laser is not simply describable by a power series; accurate description thereof in a theoretical sense requires a Volterra series description. It is the purpose of the nonlinear secondary paths to synthesize appropriate nonlinear VTFs of the second and third order respectively so the overall net VTF of the predistorter and the laser ideally is such that the CSO and CTB of the overall systems are optimally minimized, ideally nulled out.

In more detail, taking for example the case of the second order path 52 as explained above, exciting the laser with two tones at frequencies $\omega_1$, $\omega_2$ would yield a response at $\omega_1\pm\omega_2$ which is not constant over the choice of the two tones. Thus the second order path 52 is designed such that the second order intermodulation product generated in this path has the same variation over the two frequencies $\omega_1$, $\omega_2$ as does the laser response but is of opposite sign so that the two intermediate tones, the one generated in the predistorter and the one generated in the laser, cancel each other out.

Figure 4:
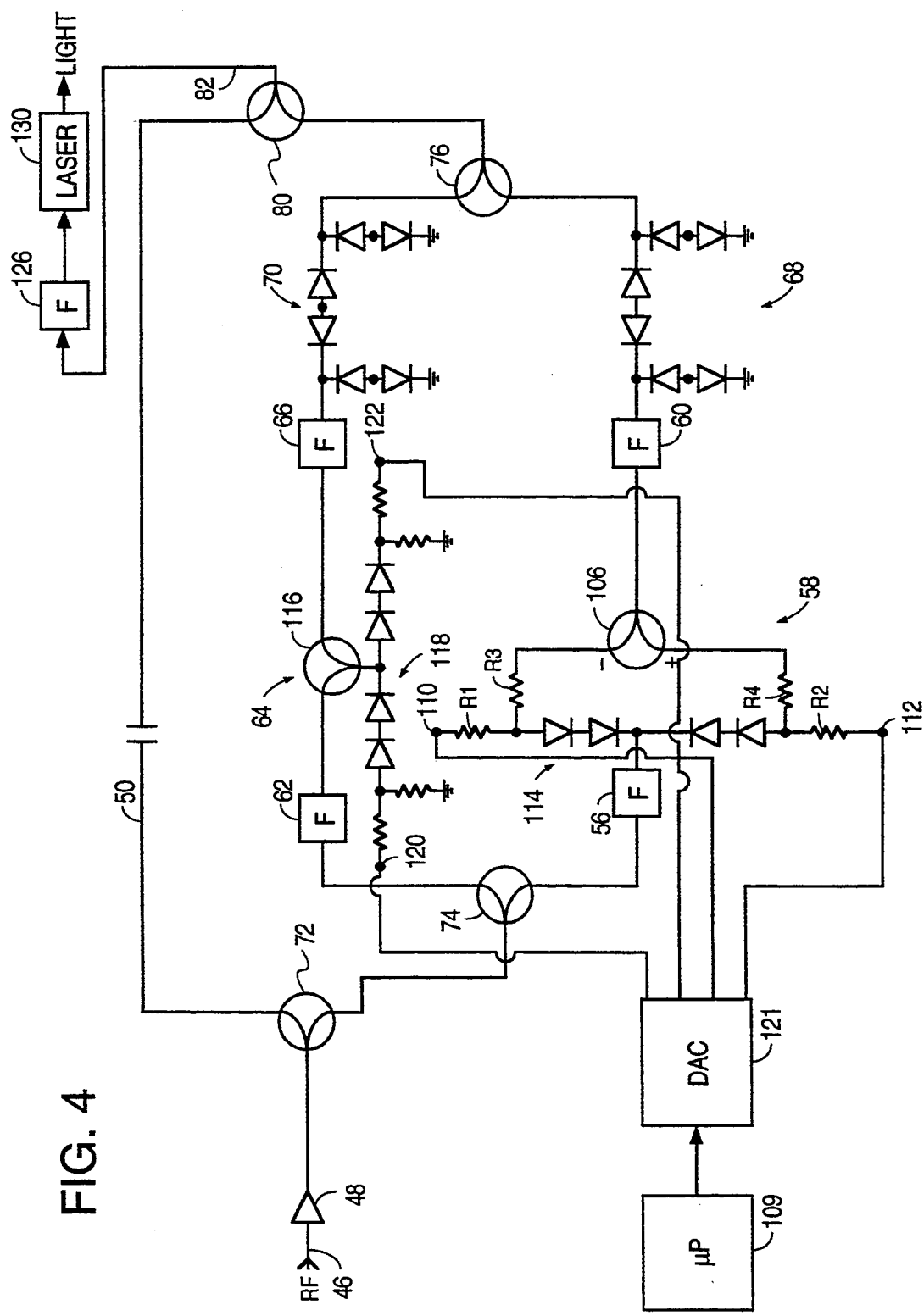
FIG. 4 is a schematic diagram of a predistorter circuit in accordance with the invention.

A more detailed predistorter circuit, corresponding to the block diagram of FIG. 3b, is shown in FIG. 4. Certain of the reference numbers in FIG. 4 are identical to those of FIG. 3b, referring to similar or identical structures.

The predriver 48 in FIG. 4 is of the push-pull power doubling type and includes a diode network (not shown) which is a variable attenuator. Input and output coupling transformers (not shown) are provided conventionally for impedance matching the input RF signal at terminal 46 and the output signal to laser 130.

The second order linearizer 58 includes a hybrid 106 connected as a combiner as shown to a circuit 114 using two diodes pairs connected as shown, with all diodes pointing the same way. A biasing current is provided to the diode network 114 by applying appropriate voltages across terminals 110, 112. The diode network 114 also includes resistors R1, R2, R3, R4 as shown. The two diode branches of network 114 are matched in resistance.

The third order linearizer 64 similarly includes a hybrid 116 with a diode network 118 connected thereto with all diodes pointing the same way. A biasing current for diode network 118 is provided by applying opposite voltages at terminals 120, 122. Both linearizers 58 and 64 are tuned for best return loss and best harmonic parity, i.e., the even and odd order linearizers generate the least odd and even signals respectively by changing the diode current (return loss, as is well known, is the reflection at an input port). Linearizer 58 is tuned for best return loss on the line connecting the output of filter 56 with the center terminal of its diode chain, looking into the diode chain. Linearizer 64 is likewise tuned for best return loss on the line connecting the center terminal of its diode chain with the middle terminal of the hybrid 64, looking into the diode chain. Once each linearizer was tuned for best return loss, then the bias current is kept constant rather than being varied for nonlinear intercept tuning. (The nonlinear intercept is a measure of the amount of nonlinearity of an electronic circuit.)

In the case of the odd order path, minimizing return loss will result in minimizing the amount of signal fundamental leaking from the input port (output of filter 62) of the hybrid 64 to its output port (input of filter 66). Instead, intercept tuning if needed (i.e., matching the intercepts of the predistorter to those of the laser for minimum composite second order or composite triple beat) is effected by means of two electronically tunable attenuators 68 and 70 connected to the outputs respectively of post-filters 60 and 66 in each path. Attenuators 68, 70 in one embodiment are PIN (p-intrinsic-n) diode networks with an insertion loss variability depending on their biasing.

The output signal from hybrid combiner 76 is connected to another hybrid combiner 80 which combines this output signal with the fundamental signal path 50. The resulting signal on line 82 is then provided to an output filter 126 and hence to the conventional DFB laser 130 which in response outputs a light signal.

Several bias voltages are required for this circuit. For purposes of manufacturability, in one embodiment each bias voltage is tuned by a computer aided manufacturing procedure so that a parameter such as CSO or CTB or a two or a three tone intermodulation product is automatically minimized and a digital controller sets the optimum analog voltages for biasing purposes. The quantities tuned are:

1. Balance (difference mode) between each pair of diode bias voltages of each linearizer 114, 118.
2. The common mode of the bias voltages (the absolute values of the two signals) which minimizes the return loss of the even order linearizer and odd order linearizer.
3. The bias voltages of the odd order and even order path variable attenuators 68, 70 determine the CTB and CSO of the entire system.
4. The conventional bias voltage and thermoelectric cooler voltage of the laser 130.
5. The predriver attenuation diode network bias voltage.

In one embodiment, each of these biasing voltages is controlled during operation of the apparatus by a microprocessor 109 driving a digital-to-analog converter circuit (121).

Adjustment of the output amplitude for each of the linearizers 58, 64 in order to tune the nonlinearities and match them to those of the laser 130 is accomplished by the variable attenuators, 68 and 70. These variable attenuators are tuned by a specific bias current. This magnitude adjustment as described above is a simple adjustment of linear attenuation, while keeping fixed the prefilter, post-filter and nonlinear circuit parameters. This is in contrast with the procedure of Blauvelt et al. where other circuit parameters are being varied.

Commercially available DFB laser 130 is of a type available from numerous manufacturers, for example Fujitsu or Mitsubishi, and includes both the laser and a photo diode for laser control purposes, as well as a thermoelectric cooler.

Figure 5:
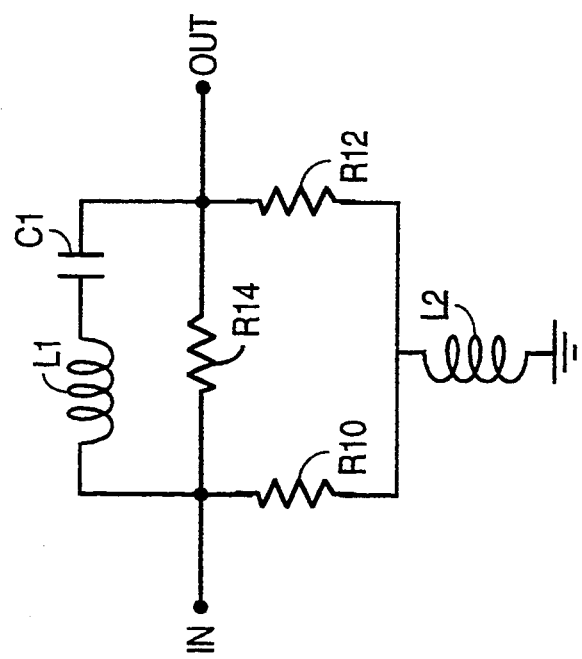
FIG. 5 shows a filter in accordance with the invention.

FIG. 5 shows internal detail of one embodiment of each of the filters 56, 60, 62 and 66 having terminals IN and OUT. In one version the values of resistors R10 and R12 are each 240 Ohms. The value of resistor R14 is 20 Ohms. The value of inductor L1 is 2 nH, the value of inductor L2 is 39 nH, and the value of capacitor C1 is 15 pf. It is to be understood that in another embodiment rather than using fixed components, instead variable components are used which are tuned to achieve a particular amount of predistortion.

Linearizer Circuits

It is to understood that variations of the linearizer circuits 58, 64 of FIG. 4 are available in accordance with the invention. Other types of hybrid transformers may also be used. In another linearizer, for instance, a diode bridge is used with the opposite terminals of the bridge connected to the terminals of the combiner 106. This provides an even order nonlinearizer, as explained in detail below.

The diode bridge version of the even order linearizer uses two diode arms to complete a full bridge, driving the bridge from two terminals on a diagonal and obtaining the outputs at the other two terminals on the other diagonal by means of an additional hybrid connected thereto. The bridge version even-order linearizer provides higher linearizer output levels then the first type, because double the number of nonlinear generators are available. However, the low impedance of the bridge means the linear excitation of the diodes is lessened by a voltage divider effect. Thus the bridge type even order linearizer appears to be less efficient and more complex then the first type.

The operation of these diode linearizing circuits is based on the fact that the diodes are "moved away" from their balance points in opposite directions, one diode towards saturation and the second diode towards reverse bias. The ensuing flow of even and odd current components results in their separation such that even order currents only appear at one connecting port and odd order currents only appear at the other connecting port.

The even order linearizer circuits provide even order currents at their outputs. However some odd order current flows to the input source resistor. Therefore, as the circuits are included in the predistorter device, the various splitters are to be sufficiently isolated so that the odd order currents appearing at the input of the even order nonlinearizer do not find their way to the laser output device.

Figure 6:
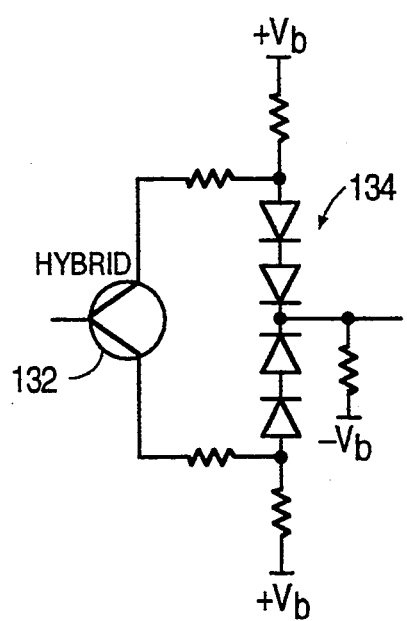
FIG. 6 shows a prior art linearizer circuit.

The second-order linearizer circuit disclosed herein is believed to be novel. Prior art discloses a linearizer circuit as shown in FIG. 6. The diodes 134 point out in opposite directions, whereas in the disclosed linearizer circuit 58 of FIG. 4 the diodes point in the same direction. The order of the hybrid 132 versus the diode circuit 134 in the prior art FIG. 6 has also been reversed in accordance with present linearizer 58, since the hybrid 132 is on the input side in the prior art circuit. The biasing of this prior art circuit is more difficult than that of the presently disclosed circuit 58 since the prior art circuit requires three bias voltages, two positive voltages on the diodes' anode sides and a negative voltage to sink the bias current out. The presently disclosed circuit 58 in contrast only requires two bias voltages: a positive voltage applied on the anode side (terminal 110) and a negative voltage applied on the cathode side (terminal 112). It can also be shown that the power consumption of the prior art linearizer is higher than of the presently disclosed linearizer. A further advantage of the circuit 58 is its similarity to the circuit used for the odd-order circuit, allowing reduction in parts diversity and cost for mass production.

Figure 7A:
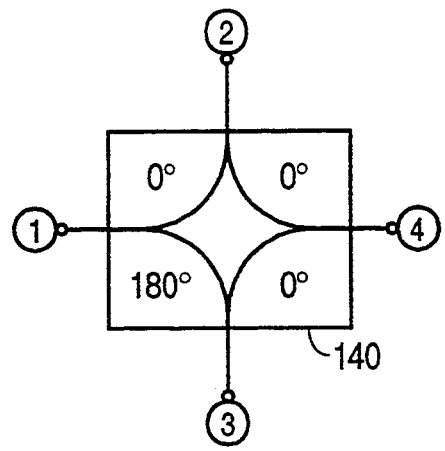
FIGS. 7a, 7b, 7c show hybrids as used in accordance with the invention.
Figure 7B:
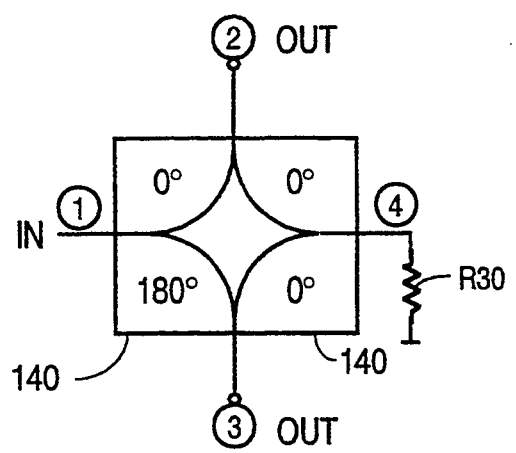

A general four-port hybrid 140 block diagram in accordance with the present invention is shown in FIG. 7a. When port 1 is the input (see FIG. 7b) the signals appearing at ports 2 and 3 are 180 degrees out of phase. Port 4 then needs to be impedance matched by a ground connection to a matching resistor R30.

Figure 7C:
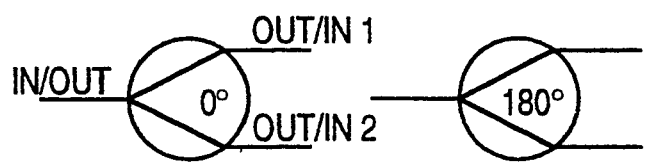

When ports 2 or 4 are the input, the signals at the ports adjacent to the input port are in phase. The port opposite the input port needs to be impedance matched. Notice that opposite ports such as 1 and 4 or 2 and 3 are mutually isolated. A shorthand notation for such a hybrid used as a 0° or 180° splitter or combiner is shown in FIG. 7c. In this notation the two right-hand wide ports are mutually isolated, i.e. when applying a signal at port OUT/IN 1, no signal will appear at port OUT/IN 2 when the port IN/OUT is terminated in a matching resistor. For example, hybrids 106 and 64 in FIG. 4 are of this type; in particular hybrid 106 is a 180° type.

Chapter 5 of the above Maas publication provides guidance in selecting circuits which generate either odd or even terms while separating the unwanted type of component. Transformer or microwave hybrids are the building blocks of some of these circuits. From the results of Maas section 5.2.1 it can be concluded that comparing a reversed biased diode with a forward biased one, the even order currents are tied to the reference direction of the diodes (flowing always into the anode) whereas the odd order currents reverse sign, flowing into the anode for the forward biased diode and out of the anode for the reverse biased diode.

According to the Volterra method of analysis of a nonlinear circuit (Chapter 4, Maas) to analyze a circuit, one first replaces its diodes by their small signal resistances and then derives the nonlinear current from the diode law $$I_d = g_1 V_d + g_2 V_d^2 + g_3 V_d^3 + \ldots$$

The current is then separated into two even and odd components $$I_d = I_d^{(e)} + I_d^{(o)}$$

where $$I_d^{(e)} = g_2 V_d^2 + \ldots$$

and $$I_d^{(o)} = g_1 V_d + g_3 V_d^3 + \ldots$$

and then the diode is replaced by its small signal resistance in parallel with the two current generators. The remarks above about the direction of even and odd currents refer to the polarities of these two signal generators.

The hybrid interconnections of Maas Chapter 5 that are relevant herein are the "Antiseries interconnection" (pp. 237, FIGS. 5.19, 5.22 of Maas) and the "Series interconnection" (p. 241, FIG. 5.23 of Maas). Also, the discussion of Maas Chapter 6, Section 6.4, FIG. 6.12 of singly balanced mixers is an example of hybrid interconnected diodes with the understanding that in the mixer there are RF and LO ports whereas, in the presently disclosed device there is a single input port. The operation of the "antiseries" and "series" inter-connections of nonlinearities and hybrids is described in Maas.

Embodiments of the present even-order nonlinear generators (the "EL") are shown in FIGS. 8a, 8b, 8c, 8d, and 8e. In these figures what is shown as a single diode can actually be a chain of diodes identically oriented, and the hybrids can be either transmission line hybrids or transformer hybrids.

Figure 8A:
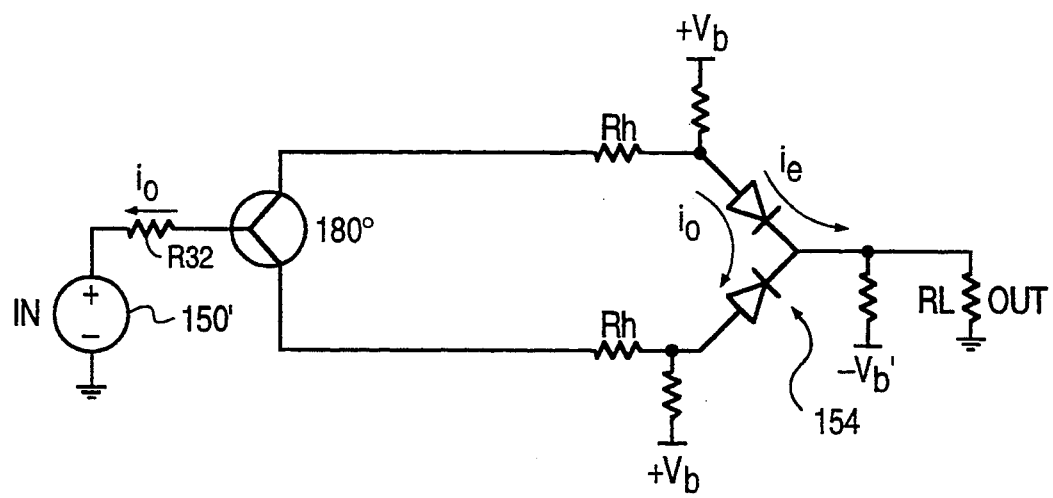
FIGS. 8a, 8b, 8c, 8d and 8e show even order linearizers in accordance with the invention.

The embodiment of FIG. 8a (called here type I EL) is in some respects similar to that of the prior art as well as to the "antiseries" circuit of Maas (e.g. the rectifier circuit of FIG. 5.22 of Maas). The individual elements of FIG. 8a (and subsequent figures) are conventional, including the RF signal source 150, various resistances (including output load $R_L$), bias voltage sources $V_b$ and $V_b'$, and a hybrid 152 connected as shown. Current flows $i_o$ (odd) and $i_e$ (even) are shown. This circuit is based on the combination of a hybrid and a "diode tee" 154. (A diode tee is a three-port device with two diode branches connected at a junction which is one of the three-port terminals, with the other two three-port terminals being the free ends of the diode branches).

A new element herein (with respect to the Maas circuits), are the resistors $R_h$ which are introduced for a dual purpose: (1) to participate in the biasing, preventing the DC shorting of the diodes anode via the hybrid, and (2) at the proper bias level to reflection match the network from both the source and load sides.

Figure 8B:
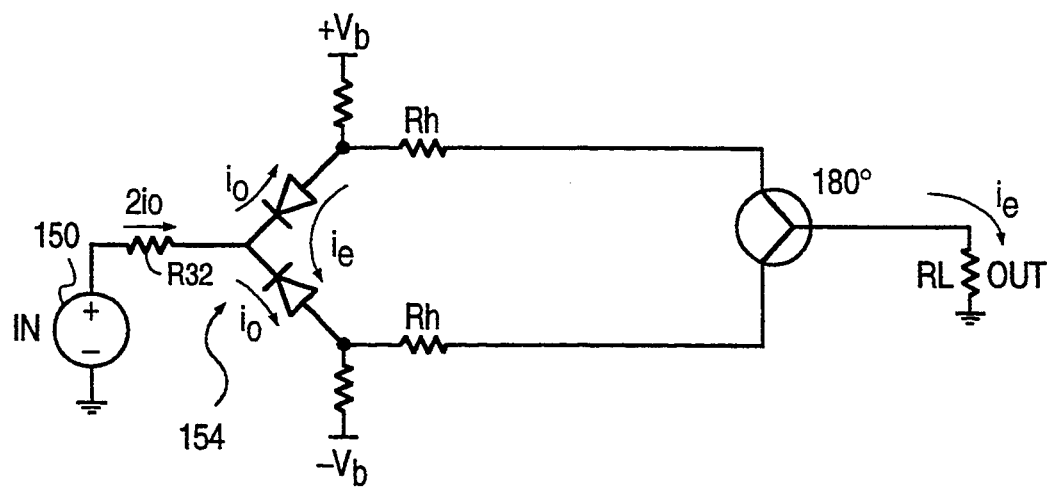

A second version of the even-order linearizer, the type II EL with similar properties and elements, is shown in FIG. 8b. In this circuit the order of the hybrid 152 and the diode tee 154 are reversed. Notice the different orientation of diodes in the branches of the diode tee 154 in the two cases. While type I EL corresponds to prior art, type II EL is novel. However, the operation of both is based on common principles. The operation of these circuits is based on the fact that the diodes are moved away from their balance point in opposite directions, one towards saturation and one towards reverse bias, and the ensuing flow of even and off components is as described by the arrows in the figures creating certain loops and paths for these currents which results in their separation such that even order currents only appear at the output and odd order currents only appear at the input. In terms of biasing decoupling capacitors are disfavored since phaseshifts are generated which yield a dephasing of the beats. Therefore all biasing decoupling is by resistive elements herein.

These two EL circuits generate even orders at their outputs $R_L$. In the type I version of FIG. 8a even orders are pumped from both diodes 154 into the load $R_L$, and in the type II version of FIG. 8b, the even current $i_e$ flowing in the loop is transmitted through the 180° hybrid 152 to the output $R_L$. However some odd order current $i_o$ will be flowing in the input source resistor R32. In the type I EL the odd order current flows in a loop including the diodes 154 and the hybrid 152 and they actually reenforce at the hybrid 152 input. Likewise in the type II EL, odd order currents are sucked out of the source resistor by both diodes 154. Therefore as the circuits are embedded in the full system of FIG. 4, consideration is made for supplying the various splitters with sufficient isolation (using e.g. transformers) so that the odd order currents appearing at the input of the even order linearizer 58 do not find their way to the laser 130.

Figure 8C:
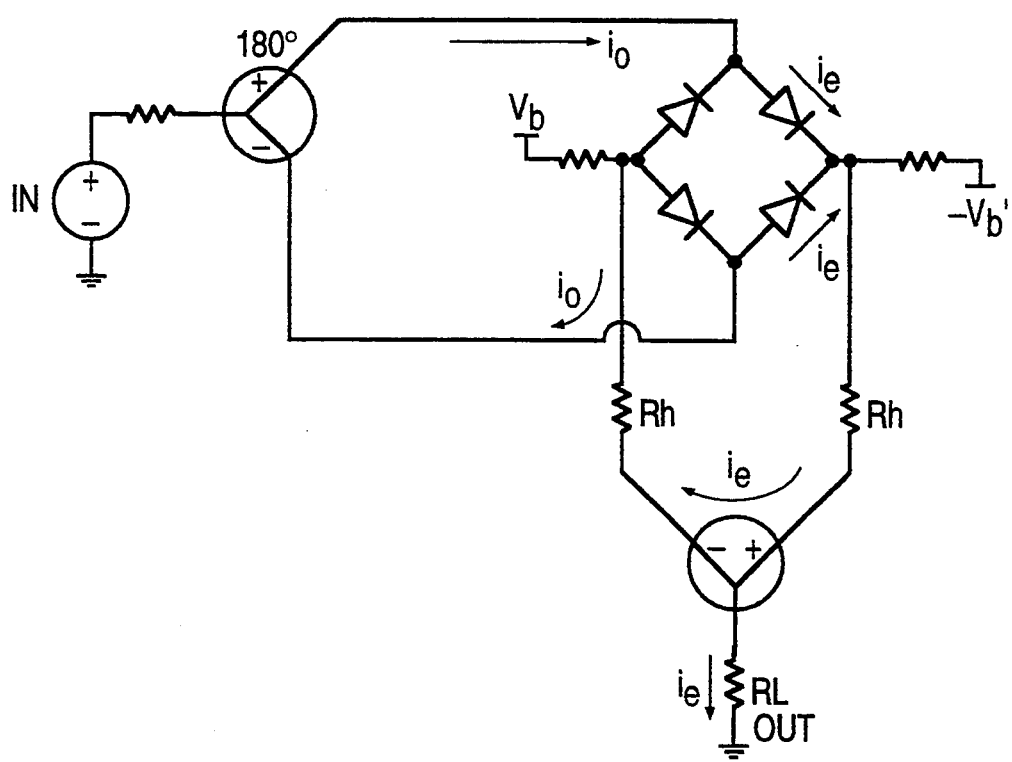

Another embodiment of the even-order linearizer is the diode bridge version in FIG. 8c. As discussed above, this version completes the two diode arms to form a full diode bridge, driving the bridge from two terminals on a diagonal and picking off the outputs at the other two terminals on the other diagonal by an additional hybrid. The flow of odd and even currents is described in the figure, substantiating the conclusion that even order currents $i_e$ emerge at the output $R_L$ while odd order currents $i_o$ emerge at the input "IN". The bridge based EL embodiment should provide higher nonlinear output levels than the type I or type II diode tee ELs, as the bridge includes two diode tees which actually double the nonlinear generators available. Unfortunately the lower impedance which the bridge presents means the linear excitation of the diode is lessened by a voltage divider action. The net effect (as borne out by a nonlinear Volterra analysis computer simulation) is that the bridge EL is actually less efficient and is also more complex requiring an extra hybrid.

Figure 8D:
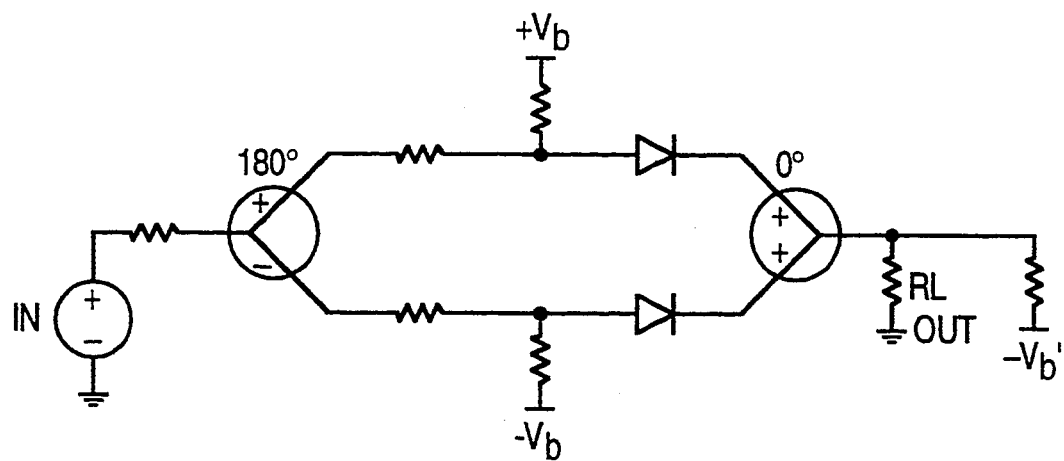
Figure 8E:
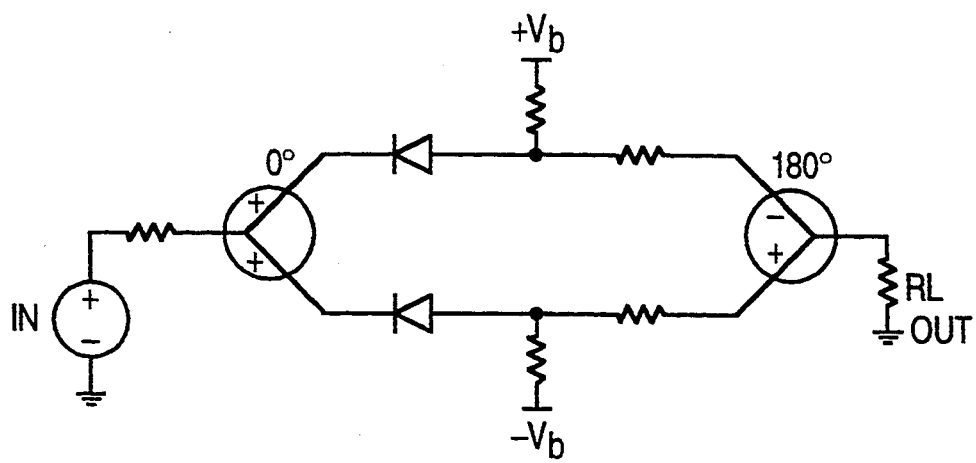

Other linearizer embodiments are shown in FIGS. 8d, 8e. They can be derived from the circuits of FIGS. 8a, 8b by substituting a second hybrid for the direct interconnection of diodes which consisted of diode leads wired together in FIGS. 8a, 8b.

Figure 9A:
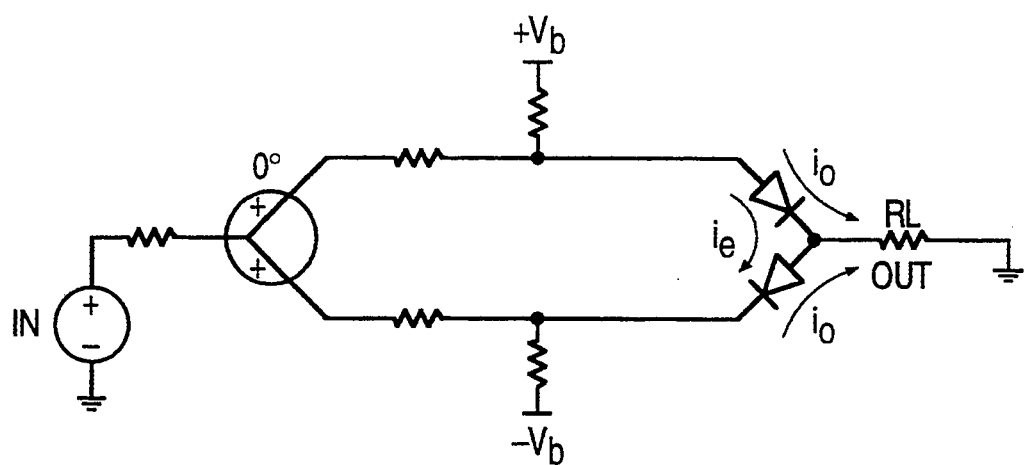
FIGS. 9a, 9b, 9c, 9d show odd order linearizers in accordance with the invention.
Figure 9B:
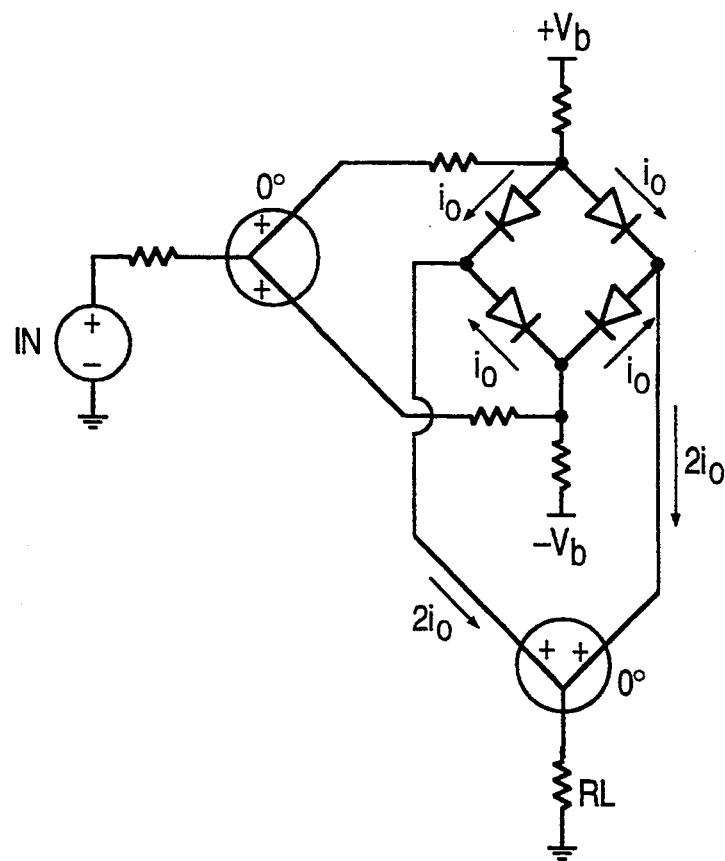

Embodiments of odd-order ("OL") linearizers are shown in FIGS. 9a, 9b. The operation of these circuits is similar to that of the above-described even order linearizers because the diodes are "moved away" from their balance points in opposite directions, one towards saturation and one towards reverse bias, and a flow of even and odd current components is set up as described by the arrows in the figures, which due to the configurations of diodes and hybrids results now in the odd terms emerging at the output $R_L$. (Unfortunately the output signal includes not only the third order desired terms but also the fundamental, which also emerges at the output).

In FIG. 9a the even order currents $i_e$ loop around and due to the 0° polarity of the hybrid they are cancelled out at the input, which is quite desirable (unlike the EL scheme where the odds do appear at the output).

Figure 9C:
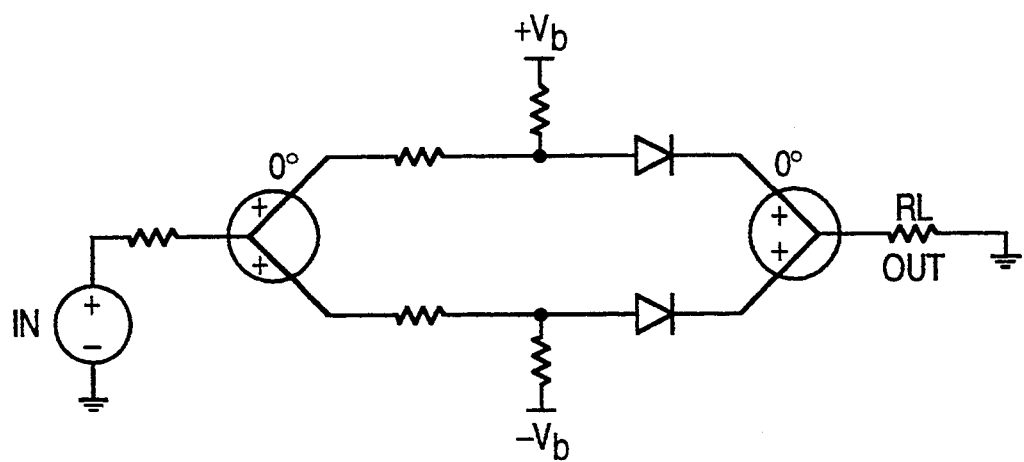
Figure 9D:
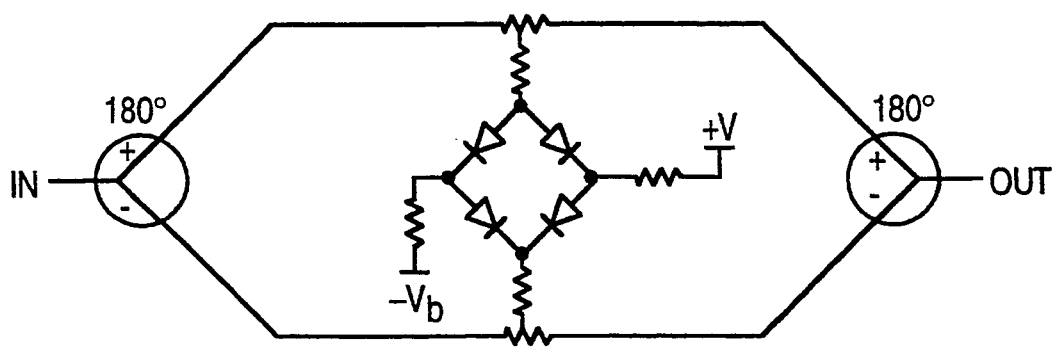

The bridge version FIG. 9b is again based on completing the two diode arms to form a full diode bridge, driving the bridge from two terminals on a diagonal by means of a 0° hybrid and picking off the outputs at the other two terminals on the other bridge diagonal by means of a second 0° hybrid. Another version shown in FIG. 9c is based on replacing the direct interconnection of diodes in FIG. 9a with a 0° hybrid interconnection. It is also possible to replace the two 0° hybrids of FIG. 9c by two 180° hybrids. Another balanced scheme is the shunt expansive one in FIG. 9d with two 180° hybrids.

Figure 10A:
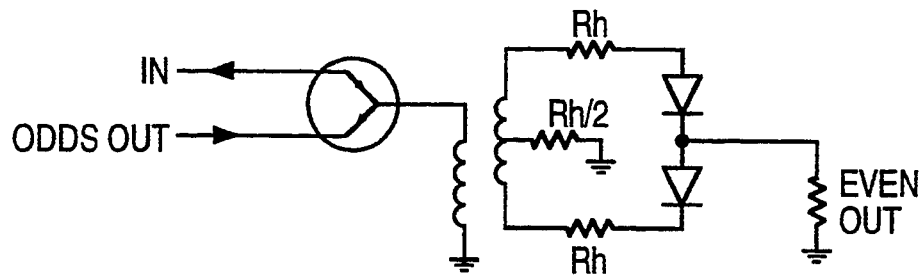
FIGS. 10a, 10b, 10c show other odd order linearizers in accordance with the invention.
Figure 10B:
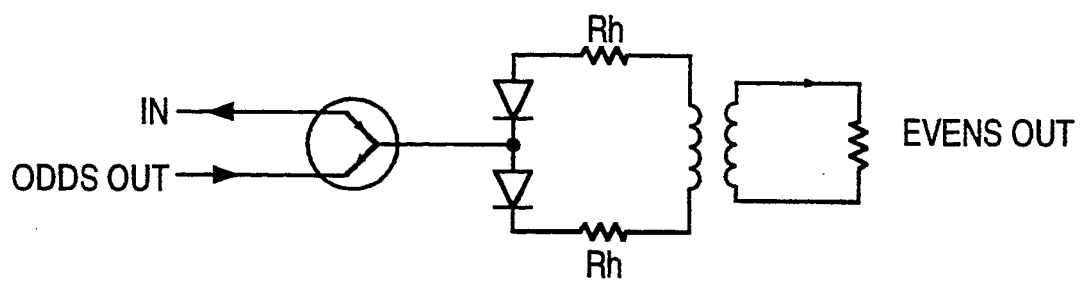
Figure 10C:
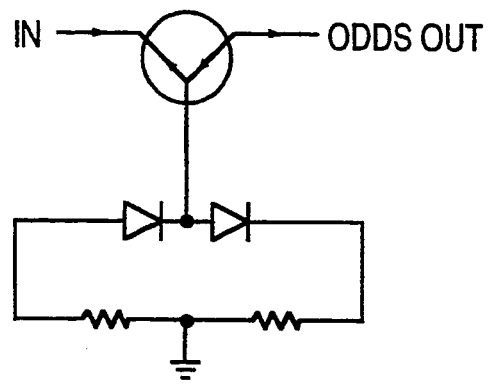

OL structures disclosed here in FIGS. 10a, 10b, 10c are based on the observation that since odd order currents are returning to the excitation side, it should be possible to capture those odd order currents by a hybrid wired in a novel way, as shown in the novel reflection-type OLs disclosed in FIGS. 10a, 10b, 10c which are derived from the two EL type I and type II versions. It should then be possible to obtain both even and odd order currents from a single circuit, which may be useful for certain applications. However, in the DFB laser linearization application, due to the need for separate pre- and post-filtering and for separate adjustment of levels by tuning the diode bias currents, using a single circuit to generate both even and odd currents is not necessarily desirable, since the prefiltering applied for one kind of linearity would affect the second kind. The present circuits disclosed in FIG. 4 simply generate odds and retrieve them at the input and discard the evens obtained at the output.

As the even order currents are discarded, the output circuitry can be further simplified to a simple resistive match, and novel OLs evolve to the structures shown in FIG. 10b, 10c. In FIG. 10c the OL derived from the type II EL has no output hybrid, and therefore is particularly simple. This is the linearizer 118 of FIG. 4.

Notice that the same device can work with either a 180° or a 0° hybrid splitter or combiner. A major advantage of the odd-order linearizer 58 of FIG. 4 disclosed herein is the ability to minimize the amount of fundamental leaking from the input port (output of filter 62) of the hybrid 64 to its output port (input of filter 66). Theoretically, with an ideal hybrid and diodes, the amount of leak-through would be zero unlike the other OL schemes where some fundamental always appears in the odd order outputs. This is due to the utilization of the hybrid, and its novel connection to the diode circuit as shown, which proves isolation between the input and output ports when impedance matched at the middle port. It is only the deviation from impedance matching generated by the variable impedance of nonlinear diode circuit, that will generate an output signal on the right hand side of the hybrid, this output signal being entirely nonlinear, of third order or higher odd order, but containing no fundamental. In practice parasitic and imperfect return loss tuning will yield some residual fundamental leak through typically better than −25 dB down from the input fundamental signal, and this low amount of fundamental will generate a negligible rise in the CTB of the total system.

In practice, the return loss will not be infinite and some fundamental will appear. If the return loss of the OL circuitry is -RT then the attenuation factor of the fundamental through the whole OL is -RT−6 dB, the factor of 6 dB corresponding to traversing the hybrid twice.

Compared with the fundamental traversing the main arm, the fundamental emerging out of the OL arm will be −6 dB further down i.e. -RT−12 dB down. This is because the odd order path includes two more couplers than the even order path. For example, for a return loss of −17 dB from the bridge one would obtain a 29 dB attenuation of the fundamental through the odd path, which in the worst case would correspond to an amplitude error of 0.3 dB or a phase error of only 2 degrees. If it were not for this suppression of the fundamental via the odd path, a much larger fundamental ripple would have been generated and furthermore quite complex frequency responses of the fundamental ripple would have emerged due to the potentially complex pre- and post-filtering.

Figure 1:
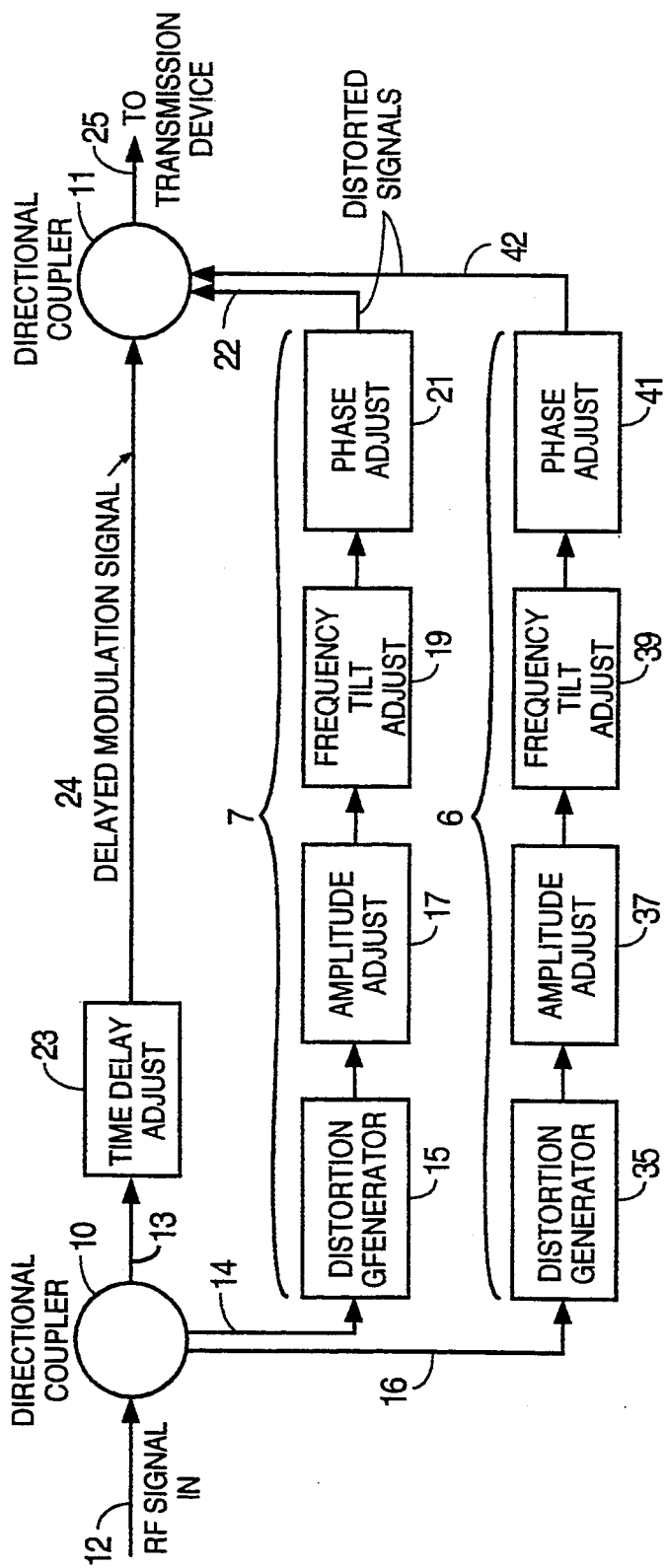
FIG. 1 shows a prior art predistorter circuit.

This suppression of fundamental leakage through the odd order path is in contrast with prior art (Blauvelt et al.) where the odd-order distortion generator 35 in present FIG. 1 is such that substantially higher amounts of fundamental signal leak through, by its very design, since there is no mechanism provided to isolate the input and output ports of the nonlinear generator 35. In the prior art, the leaking fundamental signal is frequency shaped by the frequency dependent elements 39, 41 in the nonlinear path and it adds up to the fundamental signal which comes via the main path 24 resulting in a frequency varying total fundamental signal which reduces the amount of linearization correction. In the present invention, the substantially lower (ideally zero) fundamental leak-through will result in an essentially lower CTB of the linearized laser.

Filter Selection Method

Figure 11:
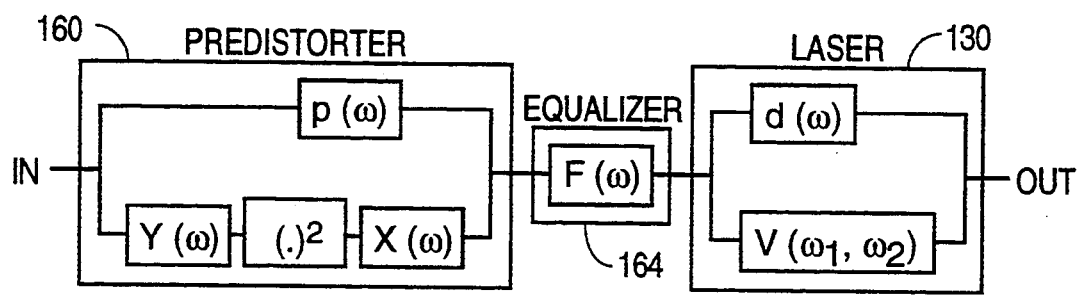
FIG. 11 shows an idealized representation of a predistorter circuit in accordance with the invention.

A method in accordance with the invention for selecting the pre- and post-filter values is described hereinafter. For purposes of this analysis, the system is considered to be a predistorter 160, a linear equalizing filter $F(\omega)$ 164 and a DFB laser 130 as shown in FIG. 11.

The predistorter 160 and the laser 130 are each considered to be the parallel connection of a linear path and a second order nonlinear path. The linear paths of the laser 130 and predistorter 160 are described by the transfer characteristics $d(\omega)$, $p(\omega)$ respectively, the nonlinear response of the laser 130 is described by the second order nonlinear Volterra transfer function $V^{(2)}(\omega_1, \omega_2)$, and the predistorter 160 is described as a "sandwich" of two linear filters with a memoriless square law nonlinearity $(.)^2$ between the two linear filters. $Y(\omega)$ and $X(\omega)$ are respectively the frequency responses of the pre- and post-linear filters 56, 66 in FIG. 4. Any coefficient associated with the squarer is assumed to be absorbed in the first filter $Y(\omega)$, and it is clear that a negative sign has been lumped with the second filter $(-X(\omega))$ to yield the linearization effect wherein the total VTF (Volterra Transfer Function) of the system will be shown to be equal to the difference of the two terms, one due to the predistorter 160 and one due to the laser 130.

In accordance with the invention, therefore there are provided novel nonlinear processes for determining in an optimal way the samples of the optimum transfer functions $Y(\omega)$, $X(\omega)$ at the channel frequencies such that the CSO (Composite Second Order) at the worst channel is minimized. This process can be shown to be optimal in a mean square sense.

To optimize a predistorter for a given DFB laser 130, a measurement or model for the complex-valued VTF of the laser is required. Such a VTF model for the DFB is known in the art (i.e., the above referenced Anchor publication). Once the complex samples of $Y(\omega)$, $X(\omega)$ at the relevant channel frequencies are determined using the novel algorithm, well known filter synthesis procedures are further applied to obtain circuit realizations of these filters. Transfer functions corresponding to the obtained samples may not be realizable, therefore what the process yields are best approximation realizable transfer functions for $Y(\omega)$, $X(\omega)$.

The VTF of the system in FIG. 11 is obtained by known Volterra series methods (see Maas) by exciting the system with two complex tones $e^{j\omega_1 t} + e^{j\omega_2 t}$ and propagating those two tones as well as the mixing product $e^{j(\omega_1+\omega_2)t}$ through the various paths. The end result is $$V_T^{(2)}(\omega_1, \omega_2) = W(\omega_1+\omega_2)[D(\omega_1,\omega_2) - Y(\omega_1)Y(\omega_2)X(\omega_1+\omega_2)]$$

where the weighting functions $W(\omega)$ and $D(\omega_1,\omega_2)$ are given by $$W(\omega) = E(\omega)d(\omega)$$

and $$D(\omega_1,\omega_2) = \frac{p(\omega_1)p(\omega_2)E(\omega_1)E(\omega_2)V^{(2)}(\omega_1,\omega_2)}{W(\omega_1+\omega_2)}$$

The individual second-order beat at frequency $\omega_1+\omega_2$ has amplitude proportional to $|V_T^{(2)}(\omega_1,\omega_2)|$, therefore the total CSO power at a "sum" beat at frequency $\omega_b$ would be given by the sum of the powers of the individual second-order beats the sum frequencies of which fall on $\omega_b$:

$$CSO[\omega_b] \sim \sum_{\{\omega_1, \omega_2\} | \omega_1+\omega_2=\omega_b} |V_T^{(2)}(\omega_1,\omega_2)|^2$$

(the symbol $\sim$ denotes proportionality) Using the above expression for the VTF yields $$CSO[\omega_b] \sim \sum_{\{\omega_1, \omega_2\} | \omega_1+\omega_2=\omega_b} |W(\omega_1+\omega_2)|^2 |D(\omega_1,\omega_2) - Y(\omega_1)Y(\omega_2)X(\omega_1+\omega_2)|^2$$

It is apparent that the CSO of the predistorted DFB laser is determined by the difference of two terms, $D(\omega_1,\omega_2)$ mainly depending on the VTF of the DFB laser, and $Y(\omega_1)Y(\omega_2)X(\omega_1+\omega_2)$ depending on the choice of pre- and post-filters. Ideally these two terms are equal over all frequencies, yielding zero CSO. The optimization problem is to choose the pre- and post-filters $Y(\omega)$, $X(\omega)$ such that the expression above is minimized.

Let $\omega_1 \to \omega$ and $\omega_2 \to \omega_b - \omega$, then $$CSO[\omega_b] \sim \sum_{\omega \in C | \omega_b - \omega \in C} |W(\omega_b)|^2 |D(\omega, \omega_b - \omega) - Y(\omega)Y(\omega_b - \omega)X(\omega_b)|^2$$

where C is the discrete set of channel frequencies. Now let frequency $\omega$ correspond to the discrete channel index i and frequency $\omega_b$ correspond to the discrete channel index k, i.e. $\omega \to i$ and $\omega_b \to k$. In NTSC television (the North American standard CATV frequency scheme) the definition of a channel index i is the integer part of the channel frequency divided by 6 MHz grid, which will make NTSC channel 2 have i=1:

$$\omega_i = 6(i+8) + 1.25 \text{ MHz}$$

The above equation for the CSO is now compactly rewritten as a summation over discrete indexes $$CSO_k = \sum_{i \in C_k} W_k |D_{ik} - Y_i Y_{k-i} X_k|^2$$

Notice that the range of summation for i is actually the set $C_k$ where $$C_k = \{i \mid \omega_i \epsilon C, \omega_k - \epsilon C\}$$

i.e. it is over a subset of the range $1 < i < k$ such that both $\omega_i$ and $\omega_k - \omega_i$ are valid channels. The disclaimer that both $\omega_i$ and $\omega_k - \omega_i$ should be valid channels is needed in case there are some holes in the channel grid (e.g. the FM band in NTSC), as well as to exclude channels that are off grid (e.g. channels 5 and 6).

So far the problem has been formulated in the last two equations in such a way that it is now characterized as a nonlinear discrete optimization problem: Choose the vectors $Y_i, X_k$, samples of the pre and post filters of the predistorter at the channel frequency grid points, such that $\text{Max}_k\{CSO_k\} \to \text{Min}$, i.e. minimize the worst CSO. A related formulation more amenable mathematically is to replace the maximum over k by a weighted sum over k of the magnitudes criterion:

$$\sum_k w_k CSO_k \to \text{Min}$$

where the summation is implied over all channels at which there is an interest in the CSO, but can be assumed to be over all channels by the artifice that the weights can be chosen zero at the channels where there is no interest in the CSO. One can choose the weights $\omega_k$ accordingly, such that the channels at which one expects the worst CSO results would be weighted more. The total weighted CSO over the channels to optimize is then $$CSO_T = \sum_{k \mid w_k \epsilon C} w_k \sum_{i \epsilon C_k} W_k |D_{ik} - Y_i Y_{k-i} X_k|^2 = \sum_k \sum_i |D_{ik} - Y_i Y_{k-i} X_k|^2$$

where $D_{ik} = w_k W_k D_{ik}$ and $X_k = w_k W_k X_k$.

This is now recognized as a least squares problem, however it is a nonlinear one since the complex variables Y,X are multiplied. It is possible to convert the problem to a linear one by observing that to minimize the difference of two complex numbers, amounts to minimizing the difference of their phases as well as minimizing the difference of their magnitudes. Furthermore if one formulates the problem in terms of magnitudes on a log scale, then the log of products of magnitudes becomes a sum of log-magnitudes and likewise the phase of a product is the sum of the phases, therefore the problem is reformatted as two problems of the type $$\sum_{k \mid W_k \epsilon C} \sum_{i \epsilon C_k} |d_{ik} - (y_i + y_{k-i} + x_k|^2 \to \text{Min}$$

where in one case
$d_{ik} = \log(D_{ik})$
$Y_i = \log(Y_i)$
$x_k = \log(X_k)$
and in the second case
$d_{ik} = \angle D_{ik}$
$Y_i = \angle Y_i$
$X_k = \angle X_k$ The generic problem (in equation form above) is then solved twice with different assignments for $d_{ik}$, $Y_i$, $x_k$, one solution generating values of the magnitudes and the second solution generating the phases of the samples of the pre- and post-filters.

Ideally for each k and for all i $$d_{ik} = y_i + y_{k-i} + x_k$$

in which case the error would go to zero, but this would yield an overdetermined system of equations, with many more equations than unknowns. It is well known in the theory of linear optimization that such overdetermined systems of equations can be "solved" by redefining the meaning of "equality", replacing it with "best approximation".

In general, consider a system of equations written in matrix form as $b = Ax$ which is overdetermined (length of the vector b exceeds that of the vector x or A is a rectangular matrix which is taller than it is wider). Then there is no solution to the system except for pathological values of the matrix coefficients, but one can solve a problem in which $b \approx Ax$ by finding the "solution" x such as the deviation of Ax away from b is minimal:

$$\|b - Ax\| \to \text{Min}$$

The solution is given by $$x = A^\dagger b$$

where $A^\dagger$ is the pseudoinverse of the matrix A, and processes to compute the pseudoinverse of a matrix exist.

At this point one completes casting the problem in a least squares linear form. So far, one has obtained a form with two running indexes k, i with the inner index i changing values while the outer index k is fixed, then k stepping up to its next values and i running again. It is possible to replace those two indexes with a single running index j which uniquely determines the corresponding values of k,i: i=i(j) and k=k(j). While the resulting form appears more complicated $$\sum_{j=1}^{N_{eq}} |d_{i(j)k(j)} - (y_{i(j)} + y_{k(j)-i(j)} + x_{k(j)})|^2 \to \text{Min}$$

now each j corresponds to a single "equation" of overdetermined system, or alternatively the index j spans the tall dimension of the matrix A in the least squares problem, which can be expressed in the compact form $$\|d - Mz\|^2 \to \text{Min}$$

where the vector $$d = \begin{bmatrix} d_1 \\ d_2 \\ \vdots \\ d_k \\ \vdots \end{bmatrix} \quad d_k = \begin{bmatrix} d_{1k} \\ d_{2k} \\ \vdots \end{bmatrix} \quad z = \begin{bmatrix} y_1 \\ y_2 \\ \vdots \\ x_1 \\ x_2 \\ \vdots \end{bmatrix}$$

and M is made out of matrix blocks $M_k$ on top of each other, wherein each matrix block $M_k$ is a matrix of zeros and ones (mostly zeros) with the ones placed such that $$M = \begin{bmatrix} M_1 \\ M_2 \\ \ldots \\ M_k \\ \ldots \end{bmatrix} \quad M_k z = \begin{bmatrix} y_1 + y_{k-1} + x_k \\ y_2 + y_{k-2} x_k \\ \ldots \\ \ldots \end{bmatrix}$$

The solution to the optimization problem is then expressed as $$z = \begin{bmatrix} y \\ x \end{bmatrix} = M \ d$$

where m is the pseudoinverse of the matrix M. The vector so obtained contains the complex samples of the pre and post filters at the channel frequencies.

The choice of the pre- and post-filters to optimize the CSO was initially shown to be a nonlinear optimization problem, and was subsequently reduced to a linear least means square optimization problem solvable by the known technique of pseudoinverses.

Starting from the uncorrected DFB laser VTF and using the processes outlined here, it is possible to find complex samples $Y_i, X_k$ of the pre and post frequency responses at the channels such that the total CSO expression (equation for $CSO_T$ above) is minimized. This is the first filter selection phase. In the second filter selection phase, known linear filter techniques are applied in order to synthesize linear circuits with frequency responses $Y(\omega), X(\omega)$ best approximating the obtained complex samples:

$Y(\omega_i) \cong Y_i$ $X(\omega_k) \cong X_k$

The application of the least means square algorithm generally leads to an arbitrary collection of values for both $Y_i$ and $X_k$, rather than yielding a constant value of all samples of $Y_i$. It is then apparent that eliminating the pre-filter $Y(\omega)$, which amounts to taking $Y_i = $ const, would have yielded a higher CSO distortion. This is yet another indication that a pre-filter, as optimally described by the profile of the complex samples $Y_i$ and best approximated by a realizable frequency response $Y(\omega)$, is indeed required to yield closer to optimum results in accordance with the invention.

It is to be understood that the above description is illustrative and not limiting; further modifications will be apparent to one skilled in the art and are intended to be covered by the appended claims.

We claim:

1. A predistorter for a transmission device, comprising:
   an input terminal;
   a first splitter connected to the input terminal;
   a first combiner connected to the first splitter by a main branch;
   and a secondary branch connected between the first splitter and the first combiner, the secondary branch comprising in series:
   a first filter that alters both phase and amplitude in a frequency dependent manner connected to the first splitter;
   a first linearizer connected to the first filter; and
   a second filter connected between the first linearizer and the first combiner.

2. The predistorter of claim 1, further comprising an additional branch connected between the first splitter and the first combiner, the additional branch comprising:
   a second splitter and a second combiner;
   a third filter connected to the second splitter;
   a second linearizer connected to the third filter; and
   a fourth filter connected between the second linearizer and the second combiner;
   wherein the second splitter is connected between the first splitter and the first filter, and the second combiner is connected between the first combiner and the second filter.

3. The predistorter of claim 2, wherein the first linearizer corrects for an n order harmonic where n is an integer and the second linearizer corrects for an n+1 order harmonic.

4. The predistorter of claim 1, further comprising a predriver connected between the input terminal and the first splitter.

5. The predistorter of claim 1, wherein the main branch includes a delay element.

6. The predistorter of claim 1, further comprising an electro-optical output device corrected to the first combiner.

7. The predistorter of claim 1, wherein the first linearizer comprises:
   an input terminal;
   a linearizer circuit connected to the input terminal; and
   a hybrid connected across the linearizer circuit.

8. The predistorter of claim 1, wherein the first linearizer comprises a diode network.

9. The predistorter of claim 8, further comprising a control circuit connected to the diode network, wherein the control circuit includes a microprocessor to control a biasing current to the diode network.

10. The predistorter of claim 1, further comprising a variable attenuator connected between the first combiner and the second filter.

11. The predistorter of claim 1, wherein each of the first and second filters is an integral equalizing filter having a similar structure and the second filter thereby alters both phase and amplitude of an input signal in a frequency dependent manner.

12. A signal distorting circuit for providing a pre-distorted signal to an output device, and comprising:
   an input terminal;
   a first filter that alters both phase and amplitude in a frequency dependent manner and is connected to the input terminal and having an output terminal;
   a linearizer circuit connected to the output terminal of the first filter and having an output terminal; and
   a second filter connected to the output terminal of the linearizer circuit, and having an output terminal.

13. A method of predistorting a signal to be transmitted by an output device, comprising the steps of:
   splitting the signal into first and second parts;
   transmitting the first part to a combiner;
   filtering the second part, altering both phase and amplitude of the second part in a frequency dependent manner;
   distorting the filtered part;
   then, again filtering the filtered part; and
   then, combining the filtered part with the first part at the combiner.

14. A method of fabricating a predistorter circuit for providing a signal to a transmission device, comprising the steps of:
   measuring nonlinear properties of the transmission device;
   connecting a first filter, a linearizer, and a second filter in that order and in series wherein the first filter alters both the phase and amplitude of a signal input to the first filter in a frequency dependent manner; and
   setting the first and second filter to produce a linear signal output from the transmission device from the signal passed through the first and second filters and the linearizer wherein the step of setting comprises setting both a phase and amplitude effect of the first and second filters relative to frequency.

15. The method of claim 14, further comprising the step of setting the linearizer to produce predetermined effects on the signal.

16. A method of predistorting a signal, comprising the steps of:
   filtering the signal in both phase and amplitude in a frequency dependent manner;
   distorting the filtered signal; and
   again filtering the distorted signal.

* * * * *

UNITED STATES PATENT AND TRADEMARK OFFICE
CERTIFICATE OF CORRECTION

PATENT NO.  : 5,424,680
DATED       : June 13, 1995
INVENTOR(S) : Moshe Nazarathy, Charles H. Gall and Chien-Yu Kuo It is certified that error appears in the above-identified patent and that said Letters Patent is hereby corrected as shown below:

Column 9, line 52, delete "$Vd^2 + g3Vd^3$" and insert -- $V_d^2 + g_3 V_d^3 +$ --.

Column 9, line 62, delete "$Vd^2$" and insert -- $V_d^2$ --.

Column 9, line 65, delete "$Vd^3$" and insert -- $V_d^3$ --.

Column 13, line 65, delete "$e^{j\omega 1 t} + e^{j\omega 2 t}$" and insert -- $e^{j\omega_1 t} + e^{j\omega_2 t}$ --.

Column 13, line 67, delete "$(\omega 1 + \omega 2)$" and insert -- $(\omega_1 + \omega_2)$ --.

Column 15, line 36, delete "$D_{ik} - Y_i Y_{k-i} X_k$" and insert -- $\hat{D}_{ik} - Y_i Y_{k-i} \hat{X}_k$ --.

Column 15, line 39, delete "$D_{ik} = w_k W_k D_{ik}$ and $X_k$" and insert -- $\hat{D}_{ik} = w_k W_k D_{ik}$ and $\hat{X}_k$ --.

Column 15, line 67, delete "$Y_i$" and insert -- $y_i$ --.

Column 16, line 5, delete "$d_{ik} = Y_i \rightleftarrows Y_{k-1} + X_k$" and insert -- $d_{ik} = y_i + y_{k-1} + x_k$ --.

UNITED STATES PATENT AND TRADEMARK OFFICE
CERTIFICATE OF CORRECTION

PATENT NO.   :   5,424,680
DATED        :   June 13, 1995
INVENTOR(S)  :   Moshe Nazarathy, Charles H. Gall and Chien-Yu Kuo It is certified that error appears in the above-identified patent and that said Letters Patent is hereby corrected as shown below:

Column 16, line 15, delete "b" and insert --$\underline{b}$--.
Column 16, line 16, delete "b" and insert --$\underline{b}$--.
Column 16, line 16, delete "x" and insert --$\underline{x}$--.
Column 16, line 16, delete "A" and insert --$\underline{A}$--.
Column 16, line 21, delete "b≈Ax" and insert --$\underline{b}≈\underline{Ax}$--.
Column 16, line 21, delete "x" and insert --$\underline{x}$--.
Column 16, line 22, delete "Ax" and insert --$\underline{Ax}$--.
Column 16, line 24, delete "∥b-Ax∥" and insert --$\|\underline{b}-\underline{Ax}\|$--.
Column 16, line 27, delete "x=A b" and insert --$\underline{x} = \underline{A}\dagger\underline{b}$--.
Column 16, line 30, delete "A " and insert --$\underline{A}\dagger$--.
Column 16, line 49, delete "A" and insert --$\underline{A}$--.
Column 16, line 52, delete "d-Mz" and insert --$\underline{d}-\underline{Mz}$--.

UNITED STATES PATENT AND TRADEMARK OFFICE
CERTIFICATE OF CORRECTION

PATENT NO. : 5,424,680
DATED : June 13, 1995
INVENTOR(S) : Moshe Nazarathy, Charles H. Gall and Chien-Yu Kuo It is certified that error appears in the above-identified patent and that said Letters Patent is hereby corrected as shown below:

Column 16, line 60, delete $$d = \begin{bmatrix} d_1 \\ d_2 \\ \dots \\ d_k \\ \dots \end{bmatrix} \quad d_k =$$

and insert $$\underline{d} = \begin{bmatrix} \underline{d}_1 \\ \underline{d}_2 \\ \dots \\ \underline{d}_k \\ \dots \end{bmatrix} \quad \underline{d}_k =$$

Column 16, line 65, delete "M" and insert --$\underline{M}$--.

UNITED STATES PATENT AND TRADEMARK OFFICE
CERTIFICATE OF CORRECTION

PATENT NO.   : 5,424,680
DATED        : June 13, 1995
INVENTOR(S)  : Moshe Nazarathy, Charles H. Gall and Chien-Yu Kuo It is certified that error appears in the above-identified patent and that said Letters Patent is hereby corrected as shown below:

Column 17, line 5, delete $$M = \begin{bmatrix} M_1 \\ M_2 \\ \ldots \\ M_k \\ \ldots \end{bmatrix} \quad M_k z =$$

and insert $$\underline{M} = \begin{bmatrix} \underline{M}_1 \\ \underline{M}_2 \\ \ldots \\ \underline{M}_k \\ \ldots \end{bmatrix} \quad \underline{M}_k \underline{z} =$$

Column 17, line 12, delete "$z = \begin{bmatrix} y \\ x \end{bmatrix} = M\ d$" and insert --$\underline{z} = \begin{bmatrix} y \\ x \end{bmatrix} = \underline{M}\dagger \underline{d}$--.

Column 17, line 16, delete "m" and insert --$M+$--.
Column 17, line 16, delete "M" and insert --$\underline{M}$--.

UNITED STATES PATENT AND TRADEMARK OFFICE
CERTIFICATE OF CORRECTION

PATENT NO. : 5,424,680
DATED : June 13, 1995
INVENTOR(S) : Moshe Nazarathy, Charles H. Gall and Chien-Yu Kuo It is certified that error appears in the above-indentified patent and that said Letters Patent is hereby corrected as shown below:

Column 17, line 16, delete "M" and insert --$\underline{M}$--.

Signed and Sealed this

Second Day of April, 1996

Attest:

BRUCE LEHMAN

*Attesting Officer*   *Commissioner of Patents and Trademarks*